United States Patent [19]
Diels et al.

[11] Patent Number: 5,650,850
[45] Date of Patent: Jul. 22, 1997

[54] BIPLANAR CUBE UNIDIRECTIONAL RING LASER GYROSCOPE

[75] Inventors: Jean-Claude M. Diels; Paul D. Pulaski, both of Albuquerque, N. Mex.

[73] Assignee: University of New Mexico, Albuquerque, N. Mex.

[21] Appl. No.: 705,073

[22] Filed: Aug. 28, 1996

Related U.S. Application Data

[63] Continuation of Ser. No. 385,338, Feb. 8, 1995, abandoned.
[51] Int. Cl.$^6$ .................................................. G01C 19/64
[52] U.S. Cl. ................................................. 356/350; 372/94
[58] Field of Search ................................ 356/350; 372/94

[56] References Cited

U.S. PATENT DOCUMENTS

| | | | |
|---|---|---|---|
| 3,538,453 | 11/1970 | Millea | 372/94 |
| 3,611,436 | 10/1971 | Ringrod | 331/94.5 |
| 4,035,081 | 7/1977 | Sepp | 356/350 |
| 4,299,490 | 11/1981 | Cahill | 356/350 |
| 4,397,027 | 8/1983 | Zampiello . | |
| 4,955,034 | 9/1990 | Scerbak . | |
| 5,004,343 | 4/1991 | Dorschner . | |
| 5,027,367 | 6/1991 | Rea, Jr. . | |
| 5,115,446 | 5/1992 | von Borstel . | |
| 5,177,764 | 1/1993 | Nilsson . | |
| 5,191,390 | 3/1993 | Diels et al. | 372/94 |
| 5,241,555 | 8/1993 | Spitzer . | |
| 5,311,538 | 5/1994 | Thorland . | |
| 5,349,601 | 9/1994 | Hohimer . | |

*Primary Examiner*—Samuel A. Turner
*Attorney, Agent, or Firm*—Peacock & Myers

[57] ABSTRACT

A laser gyroscope comprising two ninety degree turning prisms optically connected. A non-reciprocal gain layer structure is grown on the hypotenuse face of one prism.

9 Claims, 5 Drawing Sheets

BIPLANAR CUBE UNIDIRECTIONAL RING LASER GYROSCOPE

This application is a continuation of application Ser. No. 08/385,338 filed on Feb. 8, 1995, now abandoned.

BACKGROUND OF THE INVENTION

1. Field of the Invention (Technical Field)

The present invention relates to laser gyroscope apparatuses and methods of making and using same.

2. Background Art

Laser (or optical) gyroscopes are useful for missile guidance systems, aircraft guidance systems, oil drilling equipment, and robotics applications. However, preexisting laser gyroscopes have the disadvantages of being bulky and/or relatively complex, and plagued by "lock-in" effects or absence of response for low rotation. To obtain a response for all rotations, the existing laser gyro has to be given a constant mechanical motion or dither. There is a need for small laser gyros not having moving parts.

Existing laser gyroscopes are described in U.S. Pat. Nos. 5,311,538, to Thorland; 5,241,555, to Spitzer; No. 5,004,343, to Dorschner et al.; 4,397,027, to Zampiello et al.; 4,035,081, to Sepp et al.; and 4,299,490, to Cahill et al. Existing ring lasers are described in U.S. Pat. Nos. 5,349,601, to Hohimer et al.; 5,177,764, to Nilsson; 5,115,446, to von Borstel et al.; 5,027,367, to Rea, Jr. et al.; and 4,955,034, to Scerbak. A laser resonator employing one or more resonant prisms is described in U.S. Pat. No. 3,611,436, to Rigrod.

The present invention has a relatively simple structure and can be incorporated into semiconductor materials of quite small size.

SUMMARY OF THE INVENTION

Disclosure of the Invention

The present invention is of a laser gyroscope apparatus and a method for generating gyroscopic response comprising: two ninety degree turning prisms optically contacted to form a cube. In the preferred embodiment, the prisms are GaAs turning prisms, a hypotenuse face of one prisms has a non-reciprocal gain layer structure, and the cube has at least two planes into which a laser beam may be directed, generating a unidirectional ring laser. One of the ring lasers operates clockwise and the other counterclockwise, the beat frequency between said two planes exhibits a gyroscopic response, and the ring lasers do not experience injection lock-in because the weak beam of the ring lasers are ninety degrees out of phase with the strong beam of the ring lasers.

A primary object of the present invention is to provide a compact (about one cubic centimeter or less) laser gyroscope.

A primary advantage of the present invention is that it has no moving parts and therefore has a long lifetime.

Another advantage of the present invention is that it is a semiconductor device rather than a conventional gas laser gyroscope.

An additional advantage of the present invention is that it has no separate mirrors because the reflecting surfaces are part of the cavity of the invention.

Yet another advantage of the present invention is that it is not subject to "lock-in" effects.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings.

DESCRIPTION OF THE PREFERRED EMBODIMENTS

Figure 1:
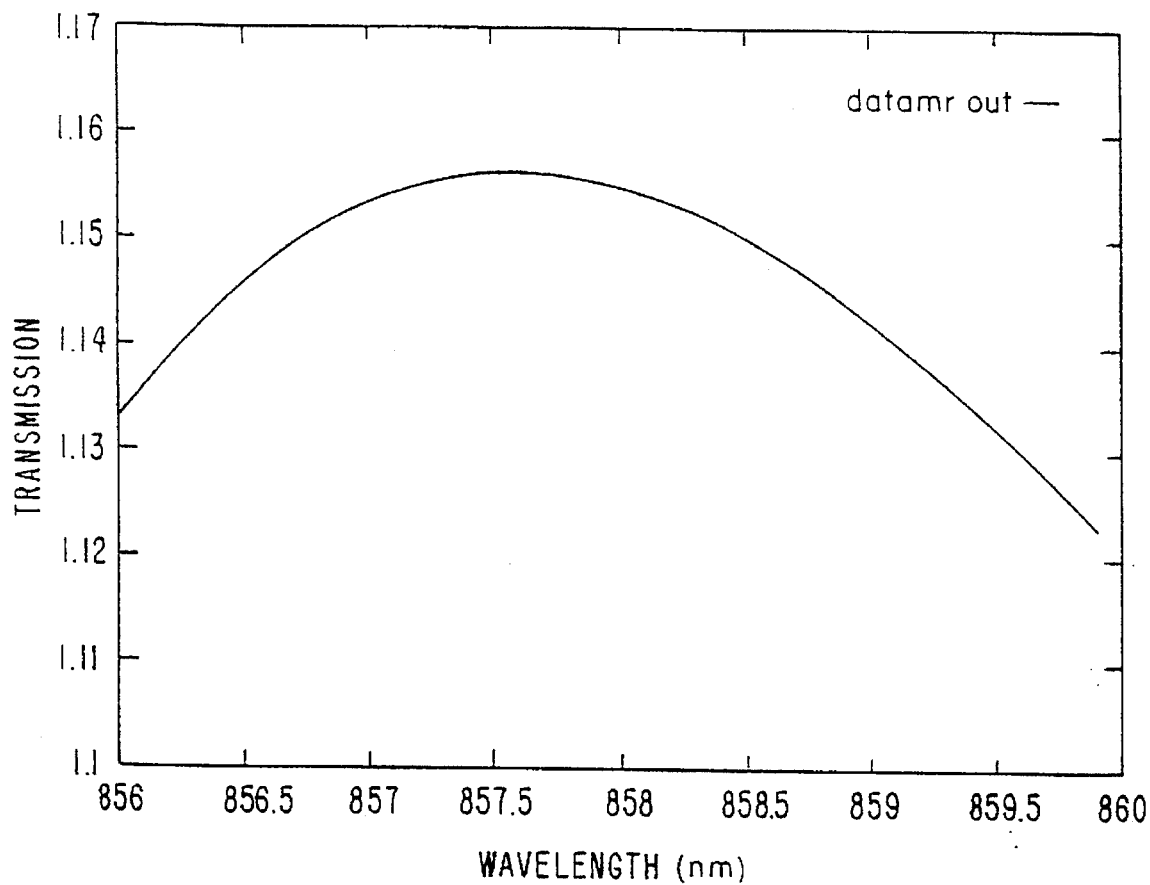
FIG. 1 is a graph of transmission versus wavelength for the structure of Table 1.

Best Modes for Carrying Out the Invention

The present invention is of a dual ring laser operating on a small cube of semiconductor material and exhibiting gyroscopic response. Each laser is preferably a unidirectional ring laser with asymmetric reflection properties.

The unidirectionality is provided as follows. A single quantum well has a thickness d much smaller than the wavelength of a given laser. In an inverted quantum well, an electric field of amplitude $\xi_i$ incident from the left, will, after transmission through the layer, become a transmitted field $\xi_t=(1+\alpha)\xi_i$. The reflected field will be $\xi_r=\alpha\xi_i$. The single amplifying quantum well can also be represented by a layer of purely imaginary index of refraction $n_g=-ik$.

Next consider a thin dielectric later, and the combined reflection from both interfaces. In the limit of zero thickness (thickness negligible compared to the laser wavelength), for an incident field $E_i$, the reflected field is $E_r=irE_i$, where r is a real quantity, proportional to the discontinuity in index $\Delta n$. This result is consistent with the previous one: for a gain medium, $\Delta n=-ik$, and the reflected field should be of the form $E_r=\alpha E_i$.

The pairing of a thin gain layer with a dielectric reflecting layer leads to a structure that is non-reciprocal. Consider, from left to right, a thin gain layer (transmission $E_t=(1+\alpha)E_i$; reflection $E_r=\alpha I_i$) followed at a distance $l=\lambda/8$ by a dielectric layer (reflection $E_r=irE_i$; transmission $$E_t = \sqrt{1-r^2}\ E_i).$$

The round trip between the two layers corresponds to a phase factor exp{2ikl}=i. Ignoring multiple reflections, the combined reflection from both interfaces, for a beam incident from the left, is: $E_r=(\alpha-r)\ E_i$, which is zero if $\alpha=r$. For a beam incident from the right, the combined reflection is: $E_r=(\alpha+r)E_i$, which is finite if $\alpha=r$.

This property can be generalized to more complex multiple quantum well structures, such as that described by Table 1.

TABLE 1

| material | thickness (nm) | index (r) | index (i) | comment |
|---|---|---|---|---|
| air | | 1.000 | 0.000 | boundary |
| $Al_{0.25}Ga_{0.75}As$ | 126.176 | 3.400 | 0.000 | stop etch layer |
| AlAs | 71.500 | 3.000 | 0.000 | |
| $Al_{0.25}Ga_{0.75}As$ | 63.088 | 3.400 | 0.000 | |
| AlAs | 71.500 | 3.000 | 0.000 | AR |
| $Al_{0.25}Ga_{0.75}As$ | 63.088 | 3.400 | 0.000 | |
| AlAs | 71.500 | 3.000 | 0.000 | AR |
| $Al_{0.25}Ga_{0.75}As$ | 63.088 | 3.400 | 0.000 | |
| AlAs | 71.500 | 3.000 | 0.000 | AR |
| $Al_{0.25}Ga_{0.75}As$ | 140.000 | 3.400 | 0.000 | reflector |
| AlAs | 30.000 | 3.000 | 0.000 | reflector |
| $Al_{0.25}Ga_{0.75}As$ | 99.706 | 3.400 | 0.000 | spacer r - $\alpha$ |
| AlAs | 30.000 | 3.000 | 0.000 | (2 layers) |
| $Al_{0.25}Ga_{0.75}As$ | 99.706 | 3.400 | 0.000 | spacer r - $\alpha$ |
| AlAs | 30.000 | 3.000 | 0.000 | (2 layers) |
| $Al_{0.25}Ga_{0.75}As$ | 125.500 | 3.400 | 0.000 | spacer r - $\alpha$ |
| GaAs | 10.000 | 3.646 | −0.014 | Quantum well |
| $Ga_{0.80}Al_{0.20}As$ | 115.000 | 3.400 | 0.000 | pump layer |
| | 10.000 | 3.646 | −0.014 | Quantum well |
| GaAs | 115.000 | 3.400 | 0.000 | pump layer |
| $Ga_{0.80}Al_{0.20}As$ | ... | ... | ... | 19 pairs total between |
| ... | 10.000 | 3.646 | −0.014 | Quantum well |
| GaAs | 115.000 | 3.400 | 0.000 | pump layer |
| $Ga_{0.80}Al_{0.20}As$ | 10.000 | 3.646 | −0.014 | Quantum well |
| | 115.000 | 3.400 | 0.000 | pump layer |
| GaAs | | | | |
| $Ga_{0.80}Al_{0.20}As$ | | | | |
| GaAs | 10.000 | 3.646 | −0.014 | last Quantum well |
| $Al_{0.25}Ga_{0.75}As$ | 125.500 | 3.400 | 0.000 | spacer |
| AlAs | 30.000 | 3.000 | 0.000 | (1 layer) |
| $Al_{0.25}Ga_{0.75}As$ | 99.706 | 3.400 | 0.000 | spacer |
| AlAs | 30.000 | 3.000 | 0.000 | (1 layer) |
| $Al_{0.25}Ga_{0.75}As$ | 149.300 | 3.400 | 0.000 | reflector |
| AlAs | 71.500 | 3.000 | 0.000 | reflector |
| $Al_{0.25}Ga_{0.75}As$ | 63.088 | 3.400 | 0.000 | AR |
| AlAs | 71.500 | 3.000 | 0.000 | AR |
| $Al_{0.25}Ga_{0.75}As$ | 63.088 | 3.400 | 0.000 | AR |
| AlAs | 71.500 | 3.000 | 0.000 | AR |
| $Al_{0.25}Ga_{0.75}As$ | 63.088 | 3.400 | 0.000 | AR |
| AlAs | 71.500 | 3.000 | 0.000 | AR |
| $Al_{0.25}Ga_{0.75}As$ | 126.176 | 3.400 | 0.000 | etch layer |
| AlAs | 10.000 | 3.000 | 0.000 | 1st etch |
| GaAs | | 3.646 | 0.000 | substrate |

Figure 2:
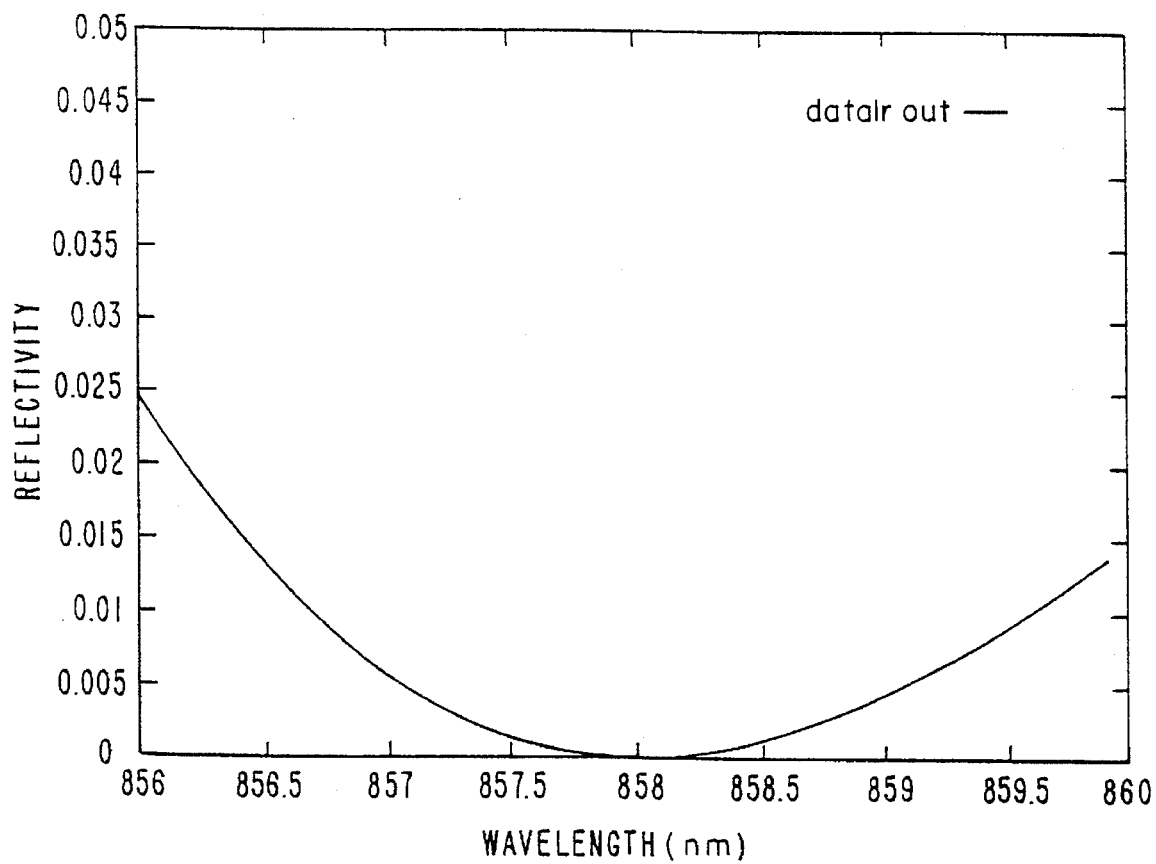
FIG. 2 is a graph of reflection (left to right) versus wavelength for the structure of Table 1.
Figure 3:
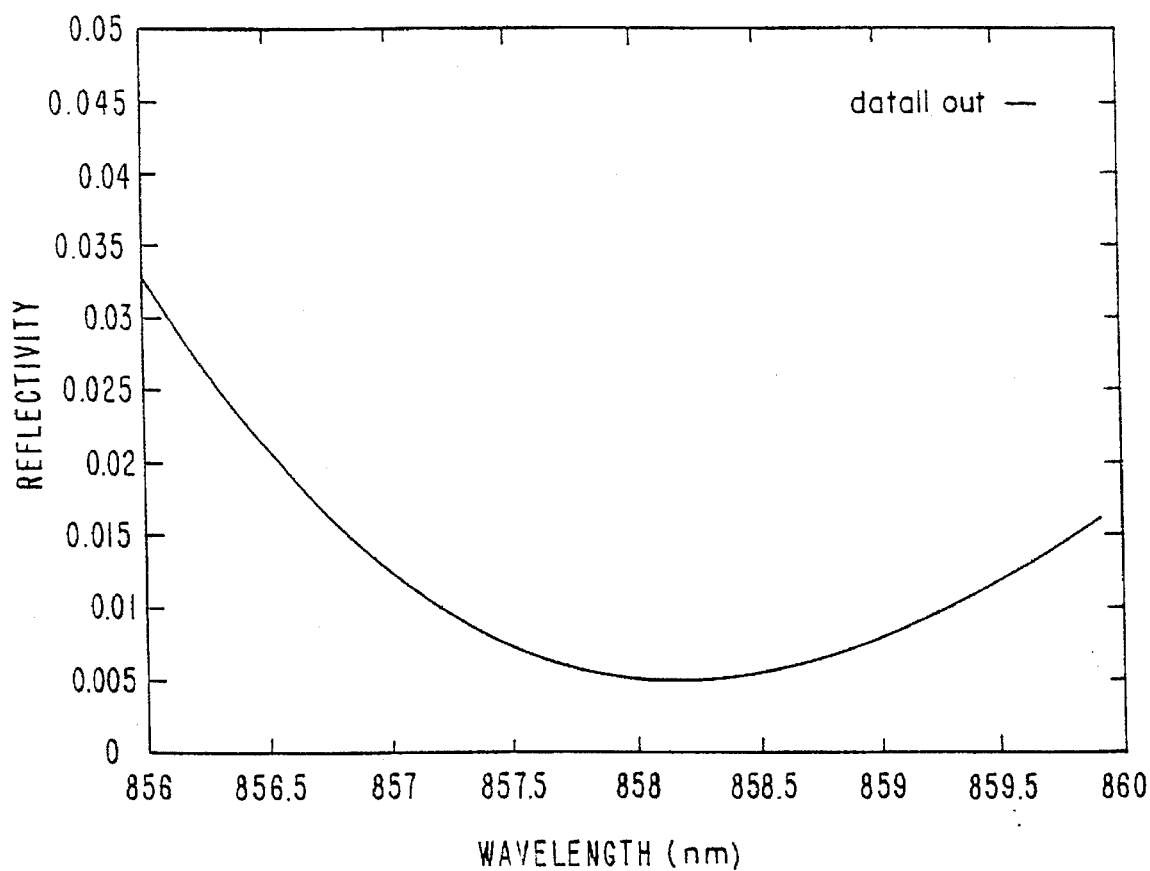
FIG. 3 is a graph of reflection (right to left) versus wavelength for the structure of Table 1.

The above structure has 20 gain layers with $\alpha=2.8\times10^{-3}$. The overall intensity transmission versus wavelength is plotted in FIG. 1. The peak at 857.64 nm does not match exactly the minimum reflectivity wavelength of 858 nm (see FIG. 2). From the other direction, the minimum reflection is 0.024, at an even longer wavelength (854.3 nm) as shown in the plot of FIG. 3. These plots do not reflect the bandwidth of the laser in operation. As the gain saturates, the values of the transmission (gain), and reflection change. As a result, the relative intensities between both directions also change.

The smaller the gain, the smaller the non-reciprocity. This tendency is obvious from the formulae for the two layer approximation: the smaller the gain, the smaller the reflectivity from right to left $i(\alpha+r)$.

Figure 4:
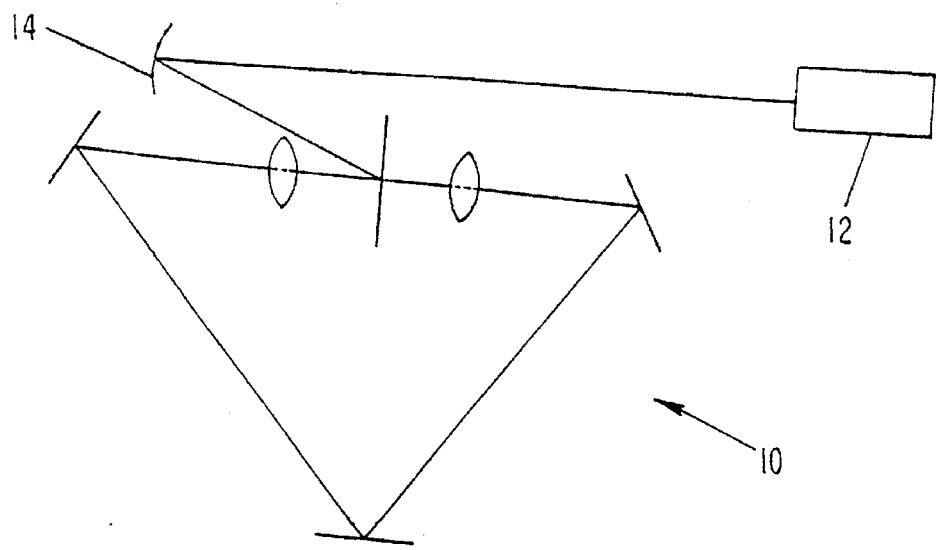
FIG. 4 is a schematic diagram of a unidirectional ring laser of the invention.

A simple unidirectional ring laser 10 is illustrated in FIG. 4. Ti:sapphire laser 12 drives the ring, initially reflecting off reflecting element 14 (such as a parabolic mirror). The elements may be made with GaAlAs structures grown on a GaAs wafer, in which case the substrate must be etched away because it absorbs laser radiation. Preferably, the elements are grown on InGaAs, which is transparent to laser radiation and so would not have to be etched away.

Figure 5:
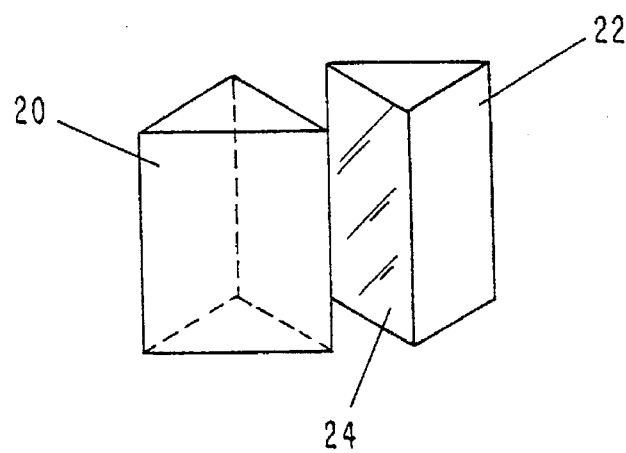
FIG. 5 is a perspective view of two 90 degree turning prisms forming the gyroscope of the invention prior to their joining.
Figure 6:
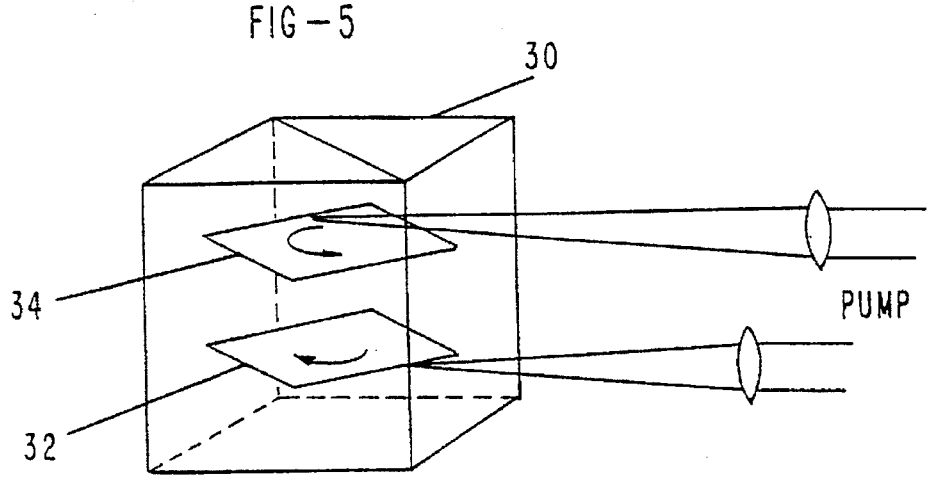
FIG. 6 is a perspective view of the preferred cubic laser gyroscope of the invention.

The preferred gyroscope of the invention comprises two GaAs 90 degree turning prisms 20 and 22 (see FIG. 5). A non-reciprocal gain layer structure is grown on the hypotenuse face 24 of one prism (InGaAs). The two prisms are thereafter optically contacted to form a cube 30 (see FIG. 6). Depending on the location of the pump spot (pump radiation around 900 nm), the lasing will be clockwise 32 or counterclockwise 34 in the cross-section of the cube. With two pump spots at different heights in the prisms, lasing can occur in opposite directions in parallel planes. Since there is no coupling between the cavities, the beat frequency between the two lasing planes exhibit a perfect gyroscopic response.

For all practical purposes, the ring laser of the invention is unidirectional. Any asymmetry is not in transmission, but in (passive) reflection. In one direction (+), the intensity increases because intensity from the other direction (−) is fed into that direction. There may be a large difference between the intensities $I_+$ and $I_-$, but the weak beam ($I_-$) will never vanish completely. Some of that weak beam is coupled back into the strong beam by the reflection at the dielectric-gain interfaces. Such a coupling injection does not lock the stronger beam (which would eliminate all possibility of gyroscopic response) because the coupling of the weak field into the strong one is of the form $i(r+\alpha)E_-$ and is thus 90 degrees out of phase with the strong field. Injection lock-in does not occur for this particular angle of coupling.

Figure 7:
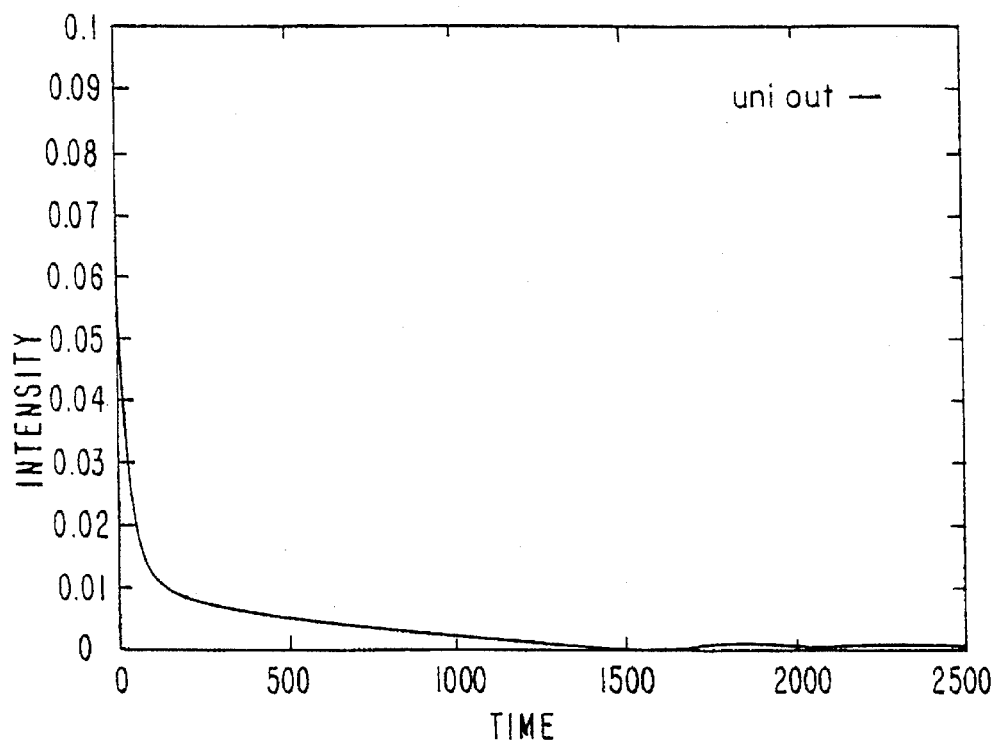
FIG. 7 is a graph of intensity versus round-trip index for a weak beam ($I_-$) of the invention.
Figure 8:
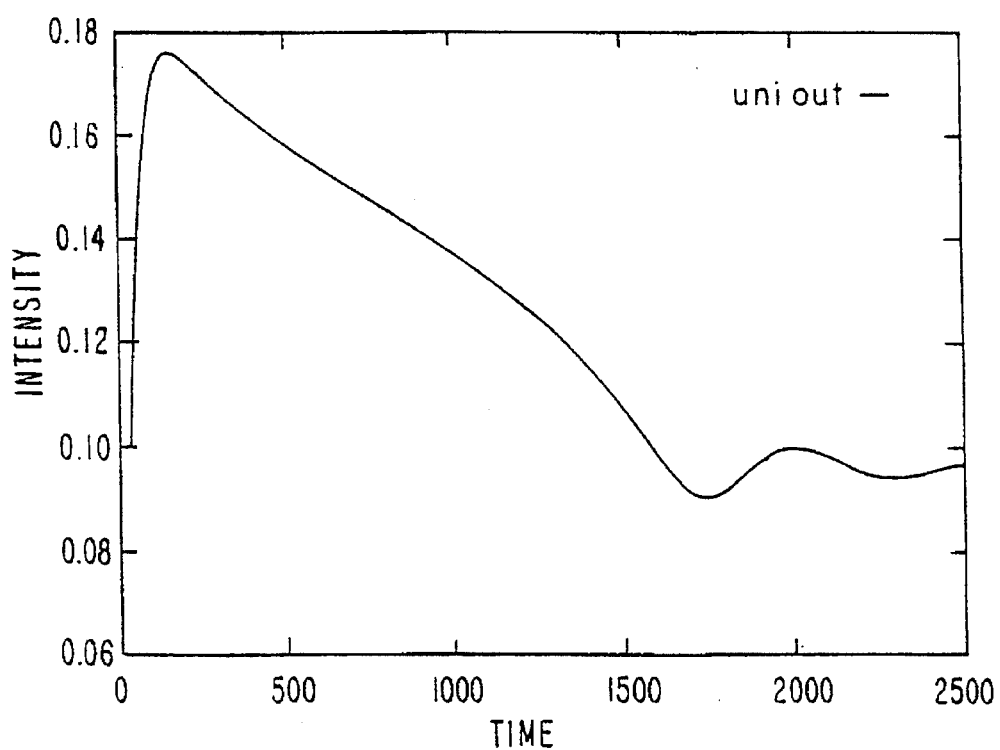
FIG. 8 is a graph of intensity versus round-trip index for a strong beam ($I_+$) of the invention.

FIGS. 7 and 8 show the evolution with time of the two intensities $I_-$ and $I_+$ in the cavity. The time is in units of cavity round-trip time, where the relevant parameters are:

| $\alpha$ | 0.080 | unsaturated gain factor |
|---|---|---|
| $\alpha_{loss}$ | 0.040 | loss/pass |
| r | 0.038 | dielectric reflectivity |
| $I_{sat}$ | 0.100 | saturation intensity |

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A laser gyroscope apparatus comprising two ninety degree turning prisms optically contacted to form a cube, said cube comprising at least two planes into which a laser beam is directed thereby forming at least two unidirectional ring lasers;

wherein said prisms comprise GaAs turning prisms;

one of said prisms comprises a hypotenuse face comprising a non-reciprocal gain layer structure;

one of said ring lasers operates clockwise and another counterclockwise; and a beat frequency between said two planes exhibits a gyroscopic response.

2. The apparatus of claim 1 wherein said ring laser does not experience injection lock-in.

3. The apparatus of claim 2 wherein, if said ring laser is not perfectly unidirectional, a weak beam of said ring laser is ninety degrees out of phase with a strong beam of said ring laser.

4. The apparatus of claim 3 wherein said strong beam comprises a beam backscattered from a non-reciprocal gain layer structure on a hypotenuse face of one of said prisms.

5. A method for generating a gyroscopic response, the method comprising the steps of:

a) providing two ninety degree turning prisms; and
 b) optically contacting the prisms to form a cube comprising at least two planes into which a laser beam is directed thereby forming at least two unidirectional ring lasers;
    wherein the providing step comprises providing GaAs turning prisms;
    the providing step comprises providing a prism comprising a hypotenuse face comprising a non-reciprocal gain layer structure; and
    the contacting step comprises forming a cube comprising at least two planes, one of which comprises a ring laser operating clockwise and another counterclockwise.

6. The method of claim 5 wherein the forming step comprises forming a cube comprising at least two planes, which comprise ring lasers for which a beat frequency between said two planes exhibits a gyroscopic response.

7. The method of claim 5 wherein the contacting step comprises forming a cube comprising at least two planes, which comprise ring lasers not experiencing injection lock-in.

8. The method of claim 7 wherein, if the ring lasers are not perfectly unidirectional, the forming step comprises forming a cube comprising at least two planes, which comprise ring lasers for which a weak beam is ninety degrees out of phase with a strong beam.

9. The method of claim 8 wherein the providing step comprises providing a prism comprising a hypotenuse face comprising a non-reciprocal gain layer structure and the forming step comprises forming a cube comprising at least two planes, which comprise ring lasers for which a weak beam is ninety degrees out of phase with a strong beam, the strong beam comprising a beam backscattered from a non-reciprocal gain layer structure on a hypotenuse face of one of the prisms.

* * * * *